United States Patent
Chang et al.

(10) Patent No.: US 12,426,199 B2
(45) Date of Patent: Sep. 23, 2025

(54) ELECTRONIC DEVICE

(71) Applicant: Getac Technology Corporation, New Taipei (TW)

(72) Inventors: Kuang-Yeh Chang, Taipei (TW); Juei-Chi Chang, Taipei (TW)

(73) Assignee: Getac Technology Corporation, New Taipei (TW)

( * ) Notice: Subject to any disclaimer, the term of this patent is extended or adjusted under 35 U.S.C. 154(b) by 244 days.

(21) Appl. No.: 18/312,559

(22) Filed: May 4, 2023

(65) Prior Publication Data

US 2024/0107700 A1 Mar. 28, 2024

Related U.S. Application Data

(60) Provisional application No. 63/410,571, filed on Sep. 27, 2022.

(30) Foreign Application Priority Data

Mar. 1, 2023 (CN) .......................... 202310181213.8

(51) Int. Cl.
*H05K 7/20* (2006.01)

(52) U.S. Cl.
CPC ..... *H05K 7/20145* (2013.01); *H05K 7/20154* (2013.01)

(58) Field of Classification Search
CPC .................. H05K 7/20145; H05K 7/20154
See application file for complete search history.

(56) References Cited

U.S. PATENT DOCUMENTS

| | | | |
|---|---|---|---|
| 6,111,748 A | 8/2000 | Bhatia | |
| 7,511,956 B2* | 3/2009 | Tomioka | ................. G06F 1/203 |
| | | | 174/15.2 |
| 7,679,907 B2* | 3/2010 | Kaneko | ................... G06F 1/203 |
| | | | 174/15.1 |
| 8,692,169 B2 | 4/2014 | Lin | |
| 9,103,606 B2 | 8/2015 | Chou | |
| 10,248,167 B1 | 4/2019 | Huang et al. | |

(Continued)

FOREIGN PATENT DOCUMENTS

| | | |
|---|---|---|
| CN | 101080147 A | 11/2007 |
| TW | I367719 B1 | 7/2012 |

(Continued)

*Primary Examiner* — Mukundbhai G Patel
(74) *Attorney, Agent, or Firm* — Cooper Legal Group, LLC

(57) ABSTRACT

An electronic device includes a casing, a concave portion, and an air outlet portion. The casing includes a first side surface, a second side surface, and a third side surface that are adjacent to each other, where two sides of the first side surface are respectively connected to the second side surface and the third side surface. The concave portion is recessed at a junction of the first side surface and the second side surface and includes a first concave surface and a second concave surface. The second side surface, the first concave surface, the second concave surface, and the first side surface are sequentially connected. The air outlet portion is arranged on the first concave surface. A length of the air outlet portion in one direction is greater than a half of a length between the second side surface and the third side surface in the direction.

21 Claims, 4 Drawing Sheets

(56) References Cited

U.S. PATENT DOCUMENTS

| | | | | |
|---|---|---|---|---|
| 2006/0238974 A1* | 10/2006 | Musgrave | ............... | G06F 1/20 |
| | | | | 361/679.48 |
| 2012/0026687 A1 | 2/2012 | Wen | | |
| 2014/0083655 A1* | 3/2014 | Wang | ..................... | F28F 7/00 |
| | | | | 165/121 |
| 2018/0006354 A1* | 1/2018 | Nivet | ................... | G06F 1/1698 |

FOREIGN PATENT DOCUMENTS

| | | |
|---|---|---|
| WO | 2018004736 A1 | 1/2018 |
| WO | 2022078420 A1 | 4/2022 |
| WO | WO 2022/181001 A1 | 9/2022 |

\* cited by examiner

ELECTRONIC DEVICE

CROSS-REFERENCES TO RELATED APPLICATIONS

This application claims the benefit of U.S. provisional application Ser. No. 63/410,571, filed on Sep. 27, 2022 and claims the priority of Patent Application No. 202310181213.8 filed in China, P.R.C. on Mar. 1, 2023. The entirety of the above-mentioned patent applications are hereby incorporated by references herein and made a part of the specification.

BACKGROUND OF THE INVENTION

Technical Field

An electronic device, in particular an electronic device includes a bidirectional air outlet path.

Related Art

For a common electronic device, in heat dissipation design, an air outlet is generally provided at an edge of a casing of the electronic device, so that airflow is discharged in a single direction. However, since the air outlet only discharges air toward a single direction, when the air outlet in the direction is shielded, heat dissipation performance of the electronic device is affected, leading to an overheated system.

SUMMARY OF THE INVENTION

In view of this, an electronic device is provided according to an embodiment. The electronic device includes a casing, a concave portion, and an air outlet portion. The casing includes a first side surface, a second side surface, and a third side surface that are adjacent to each other, where two sides of the first side surface are respectively connected to the second side surface and the third side surface. The concave portion is recessed at a junction of the first side surface and the second side surface and includes a first concave surface and a second concave surface. The second side surface, the first concave surface, the second concave surface, and the first side surface are sequentially connected. The air outlet portion is arranged on the first concave surface. A length of the air outlet portion in one direction is greater than a half of a length between the second side surface and the third side surface in the direction.

In some embodiments, a plane in which the first concave surface is located is orthogonal to a plane in which the second concave surface is located.

In some embodiments, the air outlet portion includes a first air outlet path and a second air outlet path, the first air outlet path is perpendicular to the first concave surface, and the second air outlet path is perpendicular to the second concave surface.

In some embodiments, a plurality of rib portions are arranged on the first concave surface, and the plurality of rib portions extend in a direction perpendicular to the second side surface and are arranged at intervals.

In some embodiments, an oblique surface is arranged between the first concave surface and the second concave surface, and the plurality of rib portions are arranged on the oblique surface.

In some embodiments, an oblique surface is arranged between the first concave surface and the second concave surface.

In some embodiments, the electronic device further includes a fan assembly, where the fan assembly is arranged in the casing and adjacent to the air outlet portion, and the fan assembly includes a fan including an air inlet and an air outlet.

In some embodiments, the electronic device further includes a plurality of fins, where a first end of each of the plurality of fins closely abuts against the air outlet portion, and a second end relative to the first end is adjacent to the air outlet of the fan.

In some embodiments, a predetermined distance is between the air inlet of the fan and the air outlet portion.

In some embodiments, the electronic device further includes an antenna, where the antenna is accommodated in the casing and located in an accommodation space formed by the second concave surface, the first side surface, and the third side surface.

In some embodiments, the antenna is located on one side of the concave portion.

In some embodiments, the antenna does not overlap with a fin on a projection surface perpendicular to the direction.

In addition, an electronic device is provided. The electronic device includes a casing and an air outlet portion. The casing includes a first side surface, a second side surface, and a third side surface that are adjacent to each other, where two sides of the first side surface are respectively connected to the second side surface and the third side surface. One end of the air outlet portion is connected to the second side surface, and a gap is between the air outlet portion and the first side surface; A length of the air outlet portion in one direction is greater than a half of a length between the second side surface and the third side surface in the direction.

In summary, according to the electronic device provided in the foregoing embodiments, an air outlet portion is arranged on a concave portion that inward retracts from a first side surface and a second side surface, so that there is a distance between the air outlet portion and the first side surface, and airflow can be discharged along a first concave surface, and can alternatively be discharged along a second concave surface. In this way, by increasing an air outlet path of an air outlet, even if one side direction of the electronic device is shielded, the airflow can still be discharged from an other side direction. In addition, an accommodation space formed by the second concave surface of the concave portion, the first side surface, and the third side surface accommodates an antenna, which avoids the air outlet path, and a space of a casing can be effectively used.

DETAILED DESCRIPTION OF THE INVENTION

Figure 1:
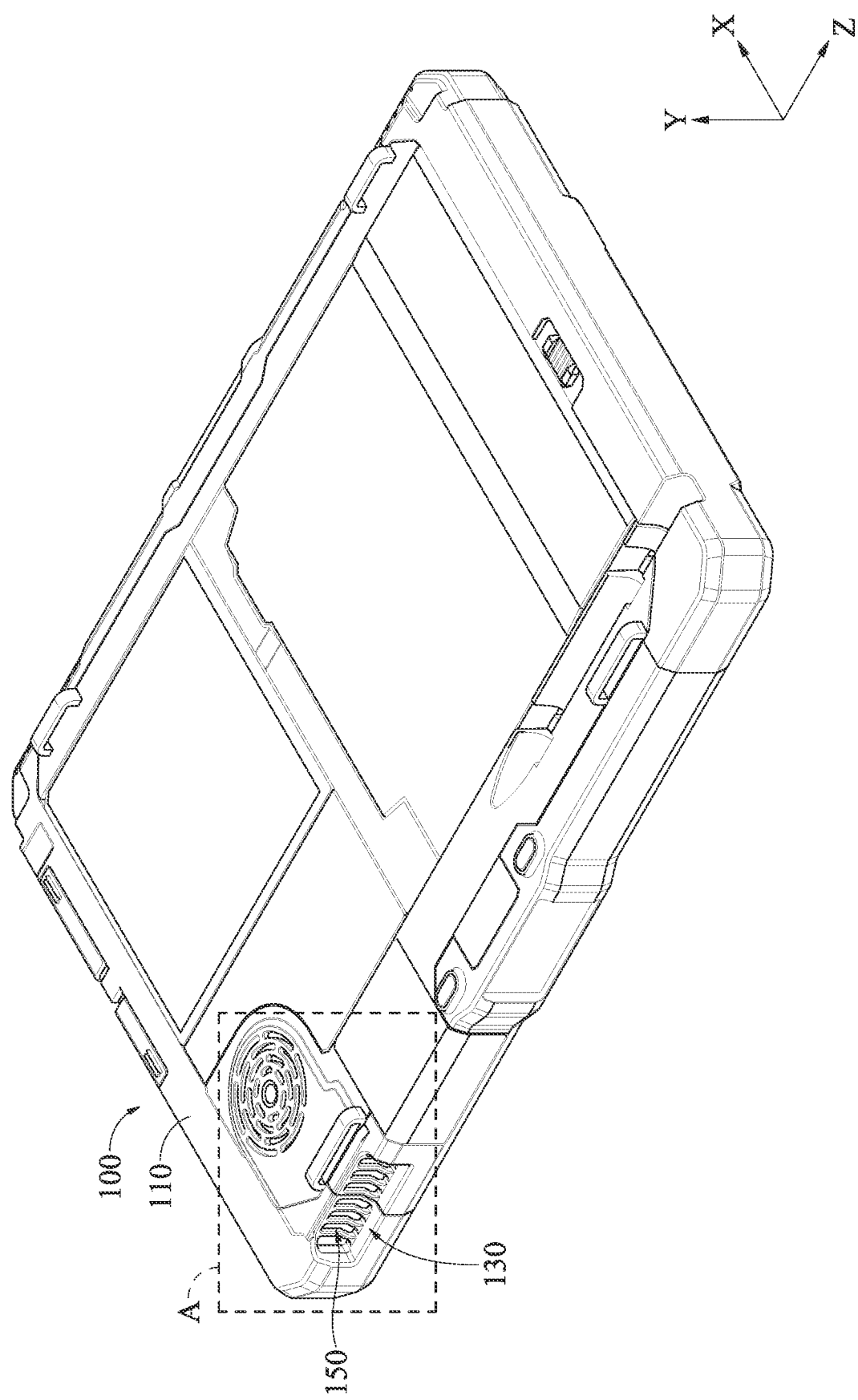
FIG. 1 is a schematic diagram of an electronic device according to an embodiment.
Figure 2:
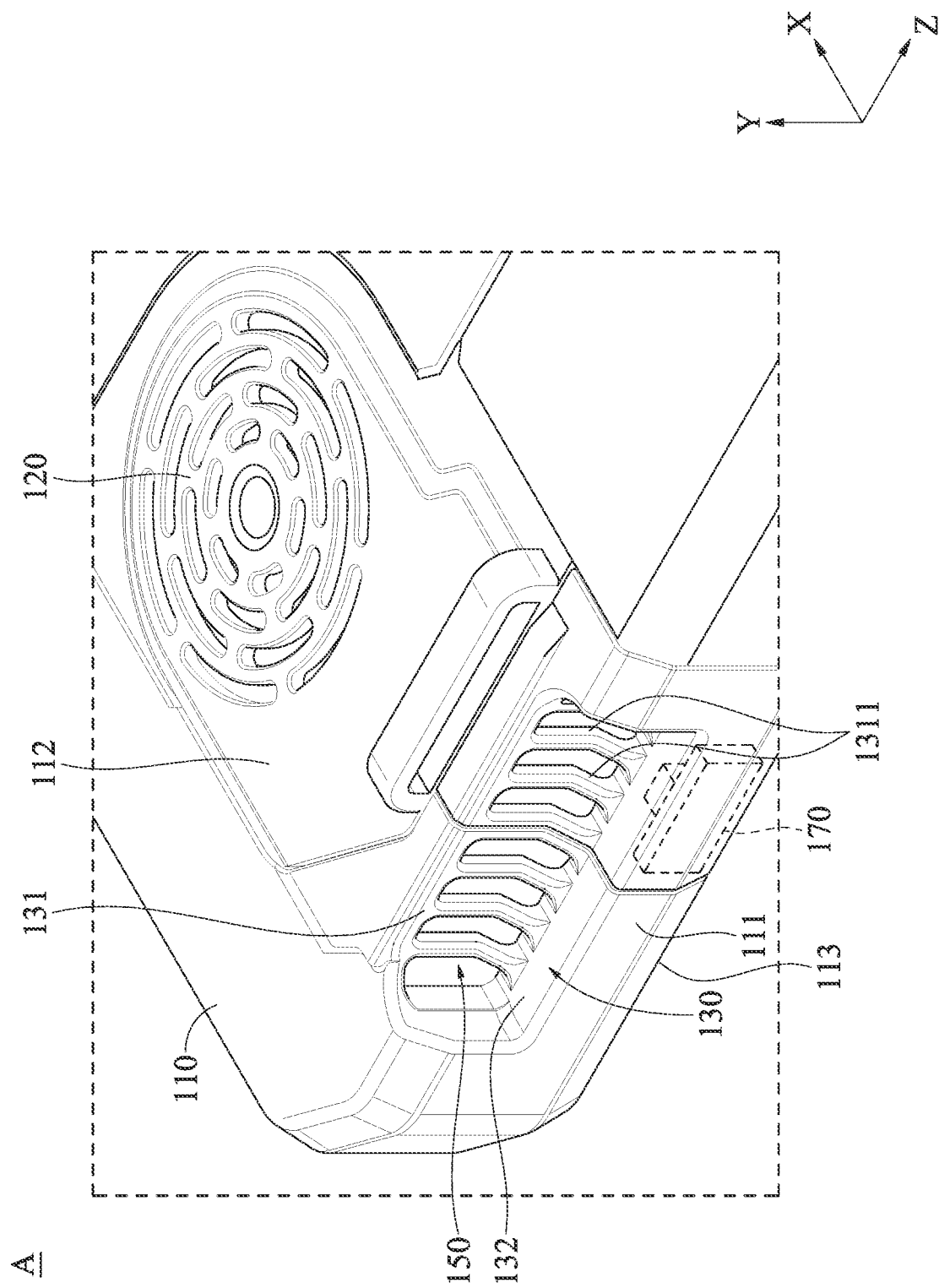
FIG. 2 is a partial enlarged view of an electronic device according to an embodiment.
Figure 3:
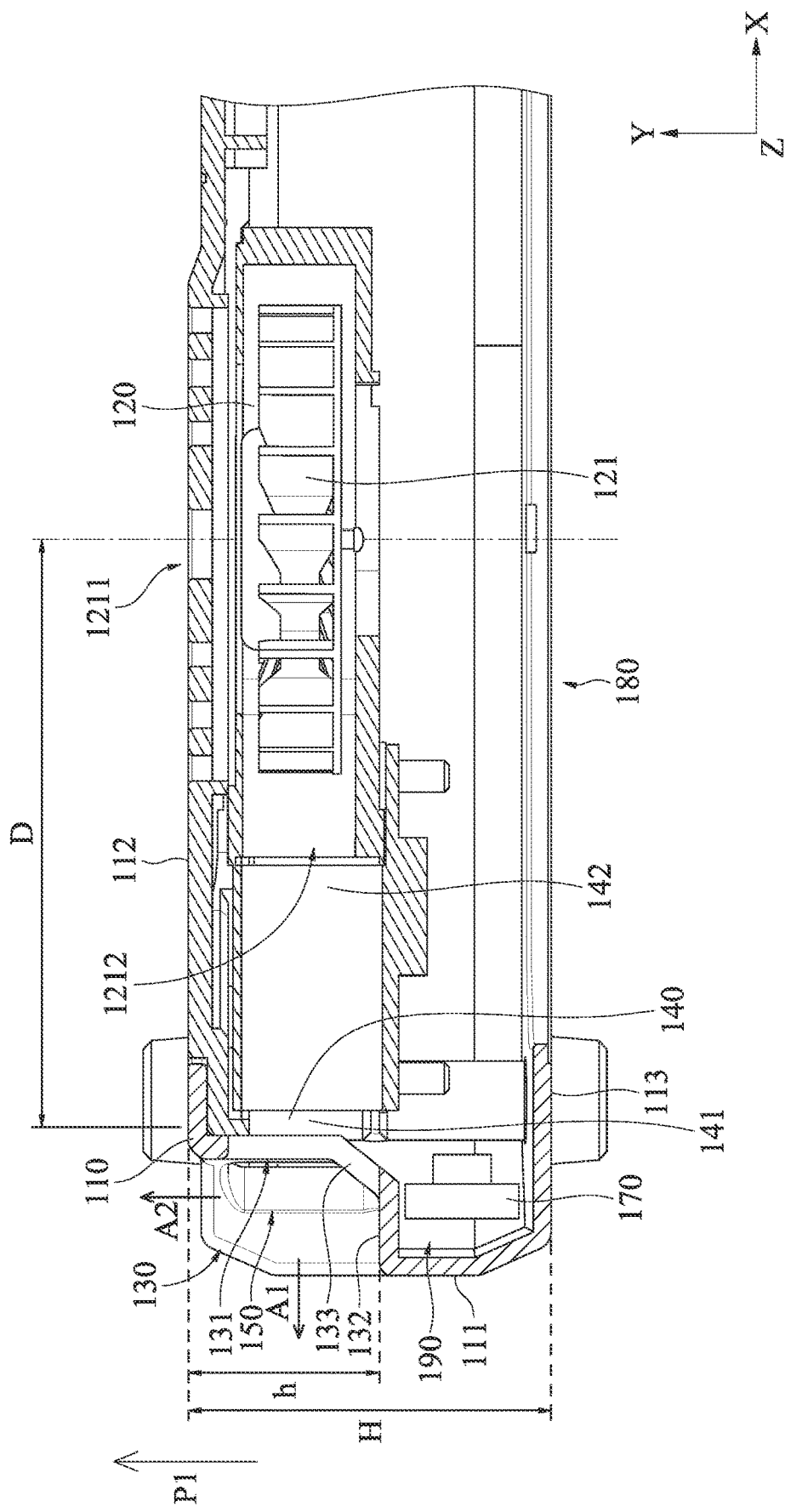
FIG. 3 is a cross-sectional view of an electronic device according to an embodiment.

Referring to FIG. 1 to FIG. 3. FIG. 1 is a schematic diagram of an electronic device according to an embodiment. FIG. 2 is a partial enlarged view of an electronic device according to an embodiment. FIG. 3 is a cross-sectional view of an electronic device according to an embodiment. An electronic device 100 includes a casing 110, a concave portion 130, and an air outlet portion 150. The electronic device 100 is, for example, a tablet computer or a notebook computer. In this embodiment, the electronic device 100 further includes an antenna 170, and a structure of the antenna 170 is described in detail later.

The casing 110 includes a first side surface 111, a second side surface 112, and a third side surface 113 that are adjacent to each other, where two sides of the first side surface 111 are respectively connected to the second side surface 112 and the third side surface 113. As shown in FIG. 2 and FIG. 3, the second side surface 112 and the third side surface 113 are two opposite surfaces. The third side surface 113 is, for example, a side of the electronic device 100 that includes a display surface 180.

A concave portion 130 is recessed at a junction of the first side surface 111 and the second side surface 112 and includes a first concave surface 131 and a second concave surface 132. The second side surface 112, the first concave surface 131, the second concave surface 132, and the first side surface 111 are sequentially connected. In this embodiment, as shown in FIG. 2 and FIG. 3, the concave portion 130 retracts inward from the first side surface 111 and the second side surface 112. The first concave surface 131 of the concave portion 130 is parallel to the first side surface 111 and there is a distance between the first concave surface 131 and the first side surface 111. The second concave surface 132 is parallel to the second side surface 112 and there is a distance between the second concave surface 132 and the second side surface 112.

The air outlet portion 150 is arranged on the first concave surface 131. In this embodiment, as shown in FIG. 2 and FIG. 3, one end of the air outlet portion 150 is connected to the second side surface 112, and an other end of the air outlet portion 150 is connected to the second concave surface 132. In addition, because the air outlet portion 150 is arranged on the first concave surface 131, there is a distance between the air outlet portion 150 and the first side surface 111, and there is also a distance between the second concave surface 132 and the second side surface 112. In this way, the air outlet portion 150 can separately discharge air along the first concave surface 131 and the second concave surface 132.

For a structure of the antenna 170, as shown in FIG. 2 and FIG. 3, in this embodiment, the antenna 170 is accommodated in the casing 110 and is located in an accommodation space 190 formed by the second concave surface 132, the first side surface 111, and the third side surface 113. The antenna 170 is located on one side of the concave portion 130. Further, the antenna 170 is located below the concave portion 130. In addition, the antenna 170 is located below the air outlet portion 150. As shown in FIG. 3, the antenna 170 is arranged on the third side surface 113 of the casing 110 and correspondingly located at a gap between the first side surface 111 and the air outlet portion 150. In this way, when the antenna 170 is arranged to avoid an air outlet path of hot air in the casing 110, a space of the casing 110 is also effectively used.

A length h of the air outlet portion 150 in a vertical direction P1 is greater than a half of a length H between the second side surface 112 and the third side surface 113 in the vertical direction P1. In this embodiment, as shown in FIG. 3, the length h of the air outlet portion 150 in a Y-axis direction is at least greater than a half of the length H between the second side surface 112 and the third side surface 113 in the Y-axis direction. In this embodiment, the length h is, for example, 11.9 mm, and the length H is, for example, 22.8 mm. In this way, the air outlet portion 150 has as much space as possible to allow airflow to be discharged successfully.

Specifically, in the electronic device 100, the air outlet portion 150 is arranged on the first concave surface 131. Because there is a distance between the first concave surface 131 and the first side surface 111, and there is a distance between the second concave surface 132 and the second side surface 112, even when one of the first side surface 111 and the second side surface 112 is shielded, the airflow can still be discharged along the second concave surface 132 toward a direction of the first side surface 111, or along the first concave surface 131 toward a direction of the second side surface 112. In this way, a problem that heat dissipation performance is affected because the air outlet portion 150 is shielded is avoided.

In this embodiment, as shown in FIG. 3, a plane in which the first concave surface 131 is located and a plane in which the second concave surface 132 is located are perpendicular and orthogonal to each other.

In this embodiment, as shown in FIG. 3, the air outlet portion 150 includes a first air outlet path A1 and a second air outlet path A2. The first air outlet path A1 is perpendicular to the first concave surface 131, and the second air outlet path A2 is perpendicular to the second concave surface 132. For example, the first air outlet path A1 is a path that is perpendicular to the first concave surface 131 and discharges air along the second concave surface 132 (that is, a direction of an X axis), and the second air outlet path A2 is a path that is perpendicular to the second concave surface 132 and discharges air along the first concave surface 131 (that is, a direction of the Y axis). The first air outlet path A1 is used as an example. When the first air outlet path A1 is shielded (for example, used upright), airflow cannot be discharged toward the direction of the first side surface 111. In this case, the airflow is discharged along the second air outlet path A2 toward the direction of the second side surface 112. In this way, a problem that air cannot be discharged successfully when the air outlet portion 150 is shielded is solved. Alternatively, the second air outlet path A2 is used as an example. When the second air outlet path A2 is shielded (for example, when the electronic device 100 is laid flat on a table top for use), airflow cannot be discharged toward the direction of the second side surface 112. In this case, airflow is discharged along the first air outlet path A1 toward the direction of the first side surface 111. In this way, the problem that air cannot be discharged successfully when the air outlet portion 150 is shielded is solved.

As shown in FIG. 2, in this embodiment, a plurality of rib portions 1311 are arranged on the first concave surface 131, and the plurality of rib portions 1311 extend along a direction perpendicular to the second side surface 112 and are arranged at intervals. As shown in FIG. 3, the plurality of rib portions 1311 are arranged at intervals to space the air outlet portion 150 into a plurality of air outlets, so that the airflow can be respectively discharged through the air outlets. In addition, as shown in FIG. 3, there is an oblique surface 133 between the first concave surface 131 and the second concave surface 132. The rib portions 1311 are also arranged on the oblique surface 133, and one end of each of the plurality of rib portions extends toward the direction of the second side surface 112 and is connected to one side of the second side surface 112. In this way, a size of the air outlet portion 150 in the Y-axis direction is increased through the oblique surface 133, and a part of the airflow can be discharged from the oblique surface 133, which increases a heat dissipation effect. In addition, an overall length of the casing 110 in the Y-axis direction is increased through the oblique surface 133, so that the accommodation space 190 is increased to accommodate the antenna 170.

As shown in FIG. 2 and FIG. 3, in this embodiment, the electronic device 100 further includes a fan assembly 120. The fan assembly 120 is arranged in the casing 110 and is adjacent to the air outlet portion 150, and the fan assembly 120 includes a fan 121 that includes an air inlet 1211 and an air outlet 1212. The air inlet 1211 is provided toward the second side surface 112, and the air outlet 1212 is provided toward the air outlet portion 150. The fan 121 guides airflow into the casing 110 through the air inlet 1211, and then airflow in the casing 110 flows toward the air outlet 1212 and is discharged from the air outlet portion 150 to achieve a heat dissipation effect.

In this embodiment, the electronic device 100 further includes a plurality of fins 140. First ends 141 of the plurality of fins 140 are adjacent to the air outlet portion 150, and second ends 142 relative to the first ends 141 are adjacent to the air outlet 1212 of the fan 121. As shown in FIG. 3, the fins 140 are arranged between the air outlet portion 150 and the air outlet 1212. Therefore, the heat dissipation effect of the electronic device 100 is increased through the fins 140. In addition, the antenna 170 and the fins 140 do not overlap on a projection surface in the vertical direction P1. The antenna 170 is arranged on a position that avoids the air outlet path of hot air inside the casing 110 passing through the fins 140, to avoid that hot air blows to the antenna 170, and a space of the casing 110 is effectively used.

In this embodiment, as shown in FIG. 3, to avoid that hot airflow blown from the air outlet 1212 to the air outlet portion 150 and discharged from the air outlet portion 150 is sucked into the casing 110 again by the air inlet 1211, there is a predetermined distance D between the air inlet 1211 of the fan 121 and the air outlet portion 150. The predetermined distance D is a distance from a rotary shaft of the fan 121 to the air outlet portion 150, and the predetermined distance D is, for example, 37.2 mm.

Figure 4:
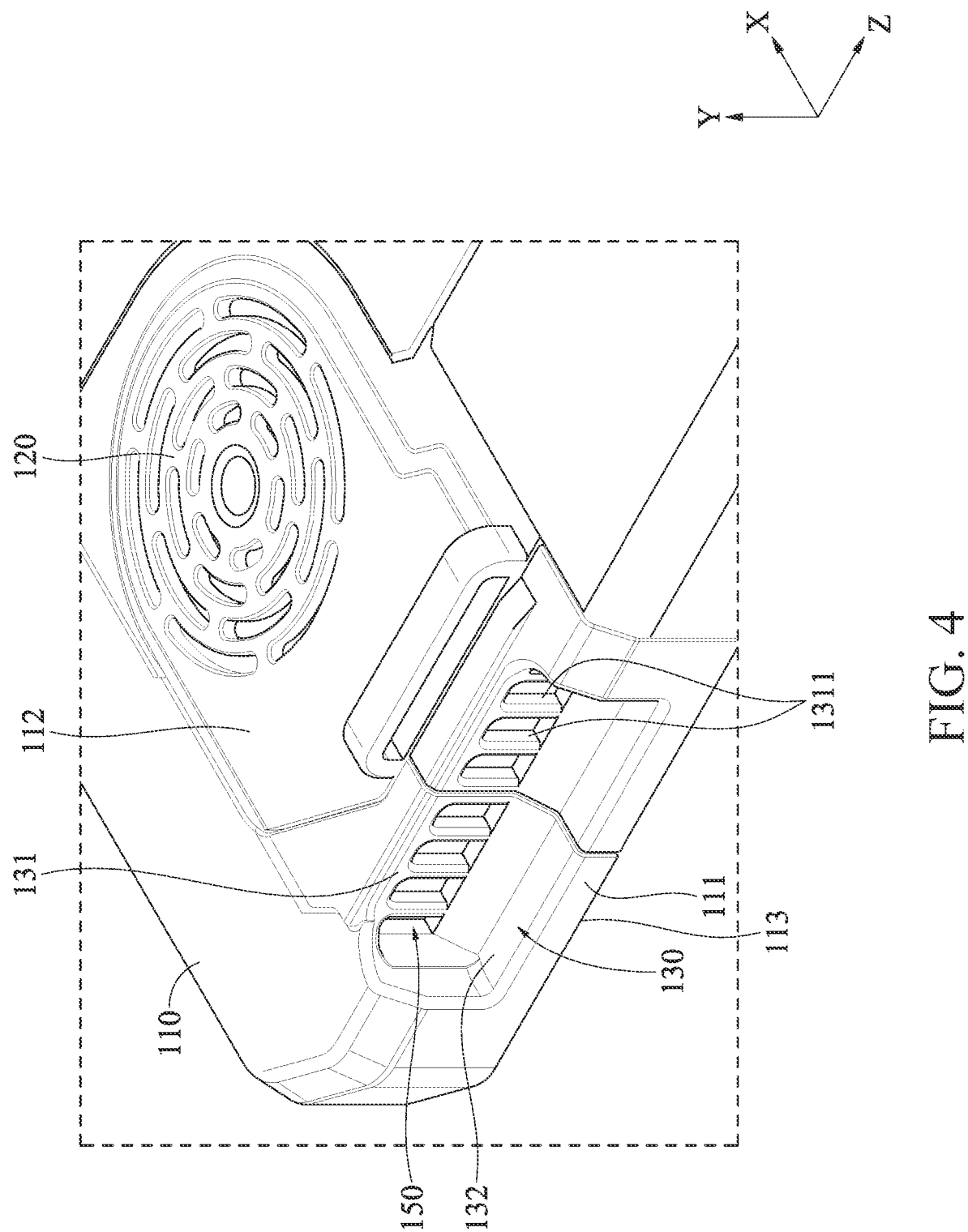
FIG. 4 is a partial enlarged view of an electronic device according to another embodiment.

Referring to FIG. 4. FIG. 4 is a partial enlarged view of an electronic device according to another embodiment. In an embodiment, it is indicated that there is an oblique surface 133 between a first concave surface 131 and a second concave surface 132, and the rib portions 1311 are also arranged on the oblique surface 133, but are not limited thereto. In another embodiment, there is an oblique surface 133 between the first concave surface 131 and the second concave surface 132, while no rib portion is arranged on the oblique surface 133. In addition, though the oblique surface 133 is not provided with a rib portion or an air outlet, by adjusting a thickness of a casing 110, that is, a distance between a second side surface 112 and a third side surface 113, a length h of an air outlet portion 150 in a Y-axis direction may still be caused to be at least greater than a half of a length H between a second side surface 112 and a third side surface 113 along the Y-axis direction.

In summary, in the electronic device 100 according to the foregoing embodiments, by arranging an air outlet portion 150 on an inward retracted concave portion 130, the air outlet portion 150 can discharge air toward a first side surface 111, and can also discharge air toward a second side surface 112. Therefore, even when one of the first side surface 111 and the second side surface 112 is shielded, airflow can be discharged toward one side that is not shielded, thereby avoiding a problem that heat dissipation performance is affected after the air outlet portion 150 is shielded. In addition, the concave portion 130 is arranged. In addition to increasing an air outlet path of the air outlet portion 150, the concave portion can also be configured to accommodate an antenna 170. An accommodation space 190 formed by a second concave surface 132 of the concave portion 130, the first side surface 111, and the third side surface 113 accommodates the antenna 170. The antenna 170 is arranged on a position that avoids an air outlet path of hot air inside the casing 110, and a space of the casing 110 is effectively used.

What is claimed is:

1. An electronic device, comprising:
a casing, comprising a first side surface, a second side surface, and a third side surface that are adjacent to each other, wherein two sides of the first side surface are respectively connected to the second side surface and the third side surface;
a concave portion, recessed at a junction of the first side surface and the second side surface, and comprising a first concave surface and a second concave surface, wherein the second side surface, the first concave surface, the second concave surface, and the first side surface are sequentially connected;
an air outlet portion, arranged on the first concave surface; and
an antenna,
wherein a length of the air outlet portion in a direction is greater than a half of a length between the second side surface and the third side surface in the direction, and the antenna is shielded from airflow exiting the air outlet portion by the second concave surface.

2. The electronic device according to claim 1, wherein a plane in which the first concave surface is located is orthogonal to a plane in which the second concave surface is located.

3. The electronic device according to claim 2, wherein an oblique surface is arranged between the first concave surface and the second concave surface.

4. The electronic device according to claim 1, wherein the air outlet portion comprises a first air outlet path and a second air outlet path, the first air outlet path is perpendicular to the first concave surface, and the second air outlet path is perpendicular to the second concave surface.

5. The electronic device according to claim 1, wherein a plurality of rib portions are arranged on the first concave surface, and the plurality of rib portions extend in a direction perpendicular to the second side surface and are arranged at intervals.

6. The electronic device according to claim 5, wherein an oblique surface is arranged between the first concave surface and the second concave surface, and the plurality of rib portions are arranged on the oblique surface.

7. The electronic device according to claim 1, further comprising a fan assembly, wherein the fan assembly is arranged in the casing and adjacent to the air outlet portion, and the fan assembly comprises a fan comprising an air inlet and an air outlet.

8. The electronic device according to claim 7, further comprising a plurality of fins, wherein a first end of each of the plurality of fins closely abuts against the air outlet portion, and a second end relative to the first end is adjacent to the air outlet of the fan.

9. The electronic device according to claim 7, wherein a predetermined distance is between the air inlet of the fan and the air outlet portion.

10. The electronic device according to claim 1, wherein the antenna is accommodated in the casing and located in an accommodation space formed by the second concave surface, the first side surface, and the third side surface.

11. The electronic device according to claim 10, wherein the antenna is located on one side of the concave portion.

12. The electronic device according to claim 10, further comprising a fan assembly and a plurality of fins, wherein a first end of each of the plurality of fins closely abuts against the air outlet portion, and a second end relative to the first end is adjacent to an air outlet of a fan of the fan assembly, and the antenna does not overlap with a fin of the plurality of fins on a projection surface perpendicular to the direction.

13. An electronic device, comprising:
a casing, comprising a first side surface, a second side surface, and a third side surface that are adjacent to each other, wherein two sides of the first side surface are respectively connected to the second side surface and the third side surface;
a concave portion, recessed at a junction of the first side surface and the second side surface and comprising a first concave surface;
an air outlet portion, wherein one end of the air outlet portion is connected to the second side surface, and a gap is between the air outlet portion and the first side surface; and
an antenna,
wherein a length of the air outlet portion in a direction is greater than a half of a length between the second side surface and the third side surface in the direction, and the antenna is shielded from airflow exiting the air outlet portion by the first concave surface.

14. The electronic device according to claim 13, wherein the air outlet portion comprises a first air outlet path and a second air outlet path, the first air outlet path is perpendicular to the first side surface, and the second air outlet path is perpendicular to the second side surface.

15. The electronic device according to claim 13, wherein the air outlet portion comprises a plurality of rib portions, one end of each of the plurality of rib portions is connected to the second side surface, and the plurality of rib portions extend in the direction and are arranged at intervals.

16. The electronic device according to claim 13, further comprising a fan assembly, wherein the fan assembly is arranged in the casing and adjacent to the air outlet portion, and the fan assembly comprises a fan comprising an air inlet and an air outlet.

17. The electronic device according to claim 16, further comprising a plurality of fins, wherein a first end of each of the plurality of fins closely abuts against the air outlet portion, and a second end relative to the first end is adjacent to the air outlet of the fan.

18. The electronic device according to claim 16, wherein a predetermined distance is between the air inlet of the fan and the air outlet portion.

19. The electronic device according to claim 18, wherein the antenna is arranged on the third side surface of the casing and correspondingly located at the gap between the first side surface and the air outlet portion.

20. The electronic device according to claim 19, wherein the antenna is located below the air outlet portion.

21. The electronic device according to claim 19, wherein the antenna does not overlap with a fin on a projection surface perpendicular to the direction.

* * * * *